(12) United States Patent
Lee et al.

(10) Patent No.: US 10,177,343 B2
(45) Date of Patent: Jan. 8, 2019

(54) LIGHT EXTRACTION SUBSTRATE FOR ORGANIC LIGHT EMITTING DEVICE, AND ORGANIC LIGHT EMITTING DEVICE COMPRISING SAME

(71) Applicant: Corning Precision Materials Co., Ltd., Chungcheongnam-do (KR)

(72) Inventors: Joo Young Lee, Chungcheongnam-do (KR); Seo Hyun Kim, Chungcheongnam-do (KR); Eun Ho Choi, Chungcheongnam-do (KR)

(73) Assignee: Corning Precision Materials Co., Ltd. (KR)

( * ) Notice: Subject to any disclaimer, the term of this patent is extended or adjusted under 35 U.S.C. 154(b) by 0 days.

(21) Appl. No.: 15/545,489

(22) PCT Filed: Jan. 20, 2016

(86) PCT No.: PCT/KR2016/000583
§ 371 (c)(1),
(2) Date: Jul. 21, 2017

(87) PCT Pub. No.: WO2016/117924
PCT Pub. Date: Jul. 28, 2016

(65) Prior Publication Data
US 2017/0373280 A1 Dec. 28, 2017

(30) Foreign Application Priority Data

Jan. 21, 2015 (KR) .................... 10-2015-0009810
Jan. 18, 2016 (KR) .................... 10-2016-0006062

(51) Int. Cl.
*H01L 51/52* (2006.01)
*H01L 51/00* (2006.01)
*H01L 51/56* (2006.01)

(52) U.S. Cl.
CPC .......... *H01L 51/5268* (2013.01); *H01L 51/00* (2013.01); *H01L 51/52* (2013.01);
(Continued)

(58) Field of Classification Search
CPC ..... H01L 51/00; H01L 51/52; H01L 51/5268; H01L 51/5275; H01L 51/56
See application file for complete search history.

(56) References Cited

U.S. PATENT DOCUMENTS 9,680,075 B2 * 6/2017 Urano .................. H01L 33/60
2008/0084150 A1 * 4/2008 Cok .................... B82Y 20/00
313/110

(Continued)

FOREIGN PATENT DOCUMENTS

KR 20130009704 A 1/2013
KR 20140032471 A 3/2014
(Continued)

OTHER PUBLICATIONS

International Search Report for Application No. PCT/KR2016/000583 dated May 24, 2016.

*Primary Examiner* — Allan R Wilson
(74) *Attorney, Agent, or Firm* — Lerner, David, Littenberg, Krumholz & Mentlik, LLP

(57) ABSTRACT

The present invention provides a light extraction substrate for an organic light emitting device, comprising: a base substrate; a scattering layer formed on the base substrate and made of $TiO_2$; a plurality of first light scatterers formed inside the scattering layer and having a porous form; and a flat layer formed on the scattering layer, wherein the scattering layer is internally permeated by a part of the materials constituting the flat layer.

26 Claims, 11 Drawing Sheets

(52) U.S. Cl.
CPC .......... *H01L 51/5275* (2013.01); *H01L 51/56* (2013.01); *H01L 2251/303* (2013.01)

(56) References Cited

U.S. PATENT DOCUMENTS

| | | | |
|---|---|---|---|
| 2012/0177909 A1* | 7/2012 | Uchino | .................... C04B 35/10 |
| | | | 428/312.6 |
| 2013/0049573 A1* | 2/2013 | Chien | ................. H01L 51/5268 |
| | | | 313/503 |
| 2014/0014923 A1 | 1/2014 | Jang et al. | |
| 2014/0042476 A1* | 2/2014 | Yoo | ......................... H01L 21/64 |
| | | | 257/98 |
| 2014/0234583 A1 | 8/2014 | Ryu et al. | |
| 2014/0335637 A1 | 11/2014 | Lee et al. | |
| 2014/0356527 A1 | 12/2014 | Yoon et al. | |
| 2016/0109099 A1* | 4/2016 | Okuno | ................ H01L 51/5271 |
| | | | 362/551 |
| 2017/0352841 A1* | 12/2017 | Lee | ..................... H01L 51/5268 |

FOREIGN PATENT DOCUMENTS

| | | |
|---|---|---|
| KR | 20140108434 A | 9/2014 |
| KR | 20140132589 A | 11/2014 |
| KR | 101468972 B1 | 12/2014 |

\* cited by examiner

LIGHT EXTRACTION SUBSTRATE FOR ORGANIC LIGHT EMITTING DEVICE, AND ORGANIC LIGHT EMITTING DEVICE COMPRISING SAME

CROSS-REFERENCE TO RELATED APPLICATION

This application is a national phase entry under 35 U.S.C. § 371 of International Application No. PCT/KR2016/000583, filed on Jan. 20, 2016, published in Korean, which claims priority to Korean Patent Application No. 10-2015-0009810, filed on Jan. 21, 2015 and Korean Patent Application No. 10-2016-0006062, filed on Jan. 18, 2016, the disclosures of which are incorporated herein by reference.

TECHNICAL FIELD

The present disclosure relates to a light extraction substrate for an organic light-emitting diode (OLED) device and an OLED device including the same. More particularly, the present disclosure relates to a light extraction substrate for an OLED device, in which the light extraction substrate can improve light extraction efficiency and can contribute to the realization of reliability in an OLED, and an OLED device including the same.

BACKGROUND ART

In general, light-emitting devices may be divided into organic light-emitting diode (OLED) devices having a light-emitting layer formed from an organic material and inorganic light-emitting devices having a light-emitting layer formed from an inorganic material. In OLED devices, OLEDs are self-emitting light sources based on the radiative decay of excitons generated in an organic light-emitting layer by the recombination of electrons injected through an electron injection electrode (cathode) and holes injected through a hole injection electrode (anode). OLEDs have a range of merits, such as low-voltage driving, self-emission of light, wide viewing angles, high resolution, natural color reproducibility, and rapid response rates.

Recently, research has been actively undertaken into applying OLEDs to portable information devices, cameras, clocks, watches, office equipment, information display devices for vehicles or similar, televisions (TVs), display devices, lighting systems, and the like.

To improve the luminous efficiency of such above-described OLED devices, it is necessary to improve the luminous efficiency of a material of which a light-emitting layer is formed or light extraction efficiency, i.e. the efficiency with which light generated by the light-emitting layer is extracted.

The light extraction efficiency of an OLED device depends on the refractive indices of OLED layers. In a typical OLED device, when a beam of light generated by the light-emitting layer is emitted at an angle greater than a critical angle, the beam of light may be totally reflected at the interface between a higher-refractivity layer, such as a transparent electrode layer functioning as an anode, and a lower-refractivity layer, such as a glass substrate. This may consequently lower light extraction efficiency, thereby lowering the overall luminous efficiency of the OLED device, which is problematic.

Described in greater detail, only about 20% of light generated by an OLED is emitted from the OLED device, while about 80% of the light generated is lost due to a waveguide effect originating from different refractive indices of a glass substrate, an anode, and an organic light-emitting layer comprised of a hole injection layer, a hole transport layer, an emissive layer, an electron transport layer, and an electron injection layer, as well as by total internal reflection originating from the difference in refractive indices between the glass substrate and ambient air. Here, the refractive index of the internal organic light-emitting layer ranges from 1.7 to 1.8, whereas the refractive index of indium tin oxide (ITO), generally used in anodes, is about 1.9. Since the two layers have a significantly low thickness, ranging from 200 nm to 400 nm, and the refractive index of the glass used for the glass substrate is about 1.5, a planar waveguide is thereby formed inside the OLED device. It is calculated that the ratio of the light lost in the internal waveguide mode due to the above-described reason is about 45%. In addition, since the refractive index of the glass substrate is about 1.5 and the refractive index of ambient air is 1.0, when light exits the interior of the glass substrate, a beam of the light, having an angle of incidence greater than a critical angle, may be totally reflected and trapped inside the glass substrate. The ratio of trapped light is about 35%. Therefore, only about 20% of generated light may be emitted from the OLED device.

To overcome such problems, light extraction layers, through which 80% of light that would otherwise be lost in the internal waveguide mode can be extracted, have been actively researched. Light extraction layers are generally categorized as internal light extraction layers and external light extraction layers. In the case of external light extraction layers, it is possible to improve light extraction efficiency by disposing a film including microlenses on the outer surface of the substrate, the shape of the microlenses being selected from among a variety of shapes. The improvement of light extraction efficiency does not significantly depend on the shape of microlenses. On the other hand, internal light extraction layers directly extract light that would otherwise be lost in the light waveguide mode. Thus, the capability of internal light extraction layers to improve light extraction efficiency may be higher than that of external light extraction layers.

However, the effect of improving light extraction efficiency using the internal light extraction layer is still insignificant with respect to the amount of outwardly emitted light. Therefore, active research into a method or technology for further improving light extraction efficiency is in demand.

DISCLOSURE

Technical Problem

Accordingly, the present disclosure has been made in consideration of the above-described problems occurring in the related art, and the present disclosure proposes a light extraction substrate for an organic light-emitting diode (OLED), in which the light extraction substrate can improve light extraction efficiency and can contribute to the realization of reliability in an OLED, and an OLED device including the same.

Technical Solution

According to an aspect of the present disclosure, a light extraction substrate for an organic light-emitting device may include: a base substrate; a scattering layer disposed on the base substrate, the scattering layer being formed from $TiO_2$, a number of voids, as first light-scattering elements, formed within the scattering layer; and a planarization layer disposed on the scattering layer. The scattering layer is infiltrated by a same material as a planarization-forming material from which the planarization layer is formed.

The scattering layer may include crystalline solids of $TiO_2$, sizes of which range from 30 nm to 50 nm.

The scattering layer may include aggregates, a plurality of crystalline solids among the crystalline solids being aggregated to form each of the aggregates, a size of which may range from 0.3 μm to 630 μm or may range from 0.035 μm to 53 μm.

The scattering layer may include crystalline solids of $TiO_2$, the crystalline solids being aggregated to form aggregates in irregular shapes.

Each of the aggregates may have a dendritic shape or a rod shape.

The first light-scattering elements may have irregular shapes.

The infiltrating material infiltrating the scattering material may fill a portion of the first light-scattering elements.

The scattering layer may include a number of particles, as second light-scattering elements, disposed within the scattering layer.

A ratio of an area of the first light-scattering elements to a total area of the scattering layer and the planarization layer may range from 1.6% to 13.2%.

A ratio of an area of the first light-scattering elements to a total area of the scattering layer may range from 6% to 20%.

The scattering layer may include a top half portion and a bottom half portion, a ratio of an area which the first light-scattering elements occupy in the bottom half portion being higher than a ratio of an area which the first light-scattering elements occupy in the top half portion.

The ratio of the area which the first light-scattering elements occupy in the bottom half portion may be two to six times the ratio of the area which the first light-scattering elements occupy in the top half portion.

The ratio of the area which the first light-scattering elements occupy in the bottom half portion to a total area of the bottom half portion may range from 14% to 18%.

The ratio of the area which the first light-scattering elements occupy in the top half portion to a total area of the top half portion may range from 3% to 8%.

The second light-scattering elements may be disposed within the bottom half portion.

The second light-scattering elements may be formed from one metal oxide or a combination of at least two metal oxides selected from a candidate group consisting of $SiO_2$, $TiO_2$, ZnO, and $SnO_2$.

Each of the second light-scattering elements may include a single portion having a single refractive index only or multiple portions having different refractive indices.

The multiple portions may include a core and a shell surrounding the core, the shell having a refractive index different from a refractive index of the core.

The core may be a hollow space.

The planarization layer may be formed from an organic/inorganic hybrimer.

The base substrate may be a flexible substrate.

The base substrate may be a thin glass sheet having a thickness of 1.5 mm or less.

According to an aspect of the present disclosure, an organic light-emitting device may include: an organic light-emitting diode; and the light extraction substrate as claimed in any one of claims 1 to 23 disposed on a path on which light emitted by the organic light-emitting diode exits.

Advantageous Effects

According to the present disclosure, since the scattering layer for the number of light-scattering elements is formed from $TiO_2$, the number of irregular-shaped voids having sizes at which light can be scattered can be formed within the scattering layer.

In addition, according to the present disclosure, since the planarization layer formed from an organic/inorganic hybrimer is disposed on the scattering layer, when the light scattering substrate is used in an OLED device, degradation of the electrical characteristics of OLED device can be prevented. In addition, since a portion of the organic/inorganic hybrimer may infiltrate into the scattering layer to occupy portions of the number of voids having open structures induced by the porous structure of the scattering layer, the remaining portions of the voids in which the organic/inorganic hybrimer is not disposed, i.e. the portions of the voids surrounded by the scattering layer and the organic/inorganic hybrimer have closed structures. Then, the portions of the voids having the closed structures can act as light-scattering elements having a refractive index of 1.

Furthermore, according to the present disclosure, the void-shaped light-scattering elements respectively have the multi-refractive-index core-shell structure. In particular, the core is a hollow space. These features can further improve the light extraction efficiency of the OLED device.

According to the present disclosure, it is therefore possible to improve the light extraction efficiency of the OLED device and contribute to the realization of reliability in the OLED device.

MODE FOR INVENTION

Hereinafter, a light extraction substrate for an organic light-emitting diode (OLED) device and an OLED device including the same, according to exemplary embodiments, will be described in detail with reference to the accompanying drawings.

In the following disclosure, detailed descriptions of known functions and components incorporated in the present disclosure will be omitted in the case that the subject matter of the present disclosure may be rendered unclear by the inclusion thereof.

Figure 1:
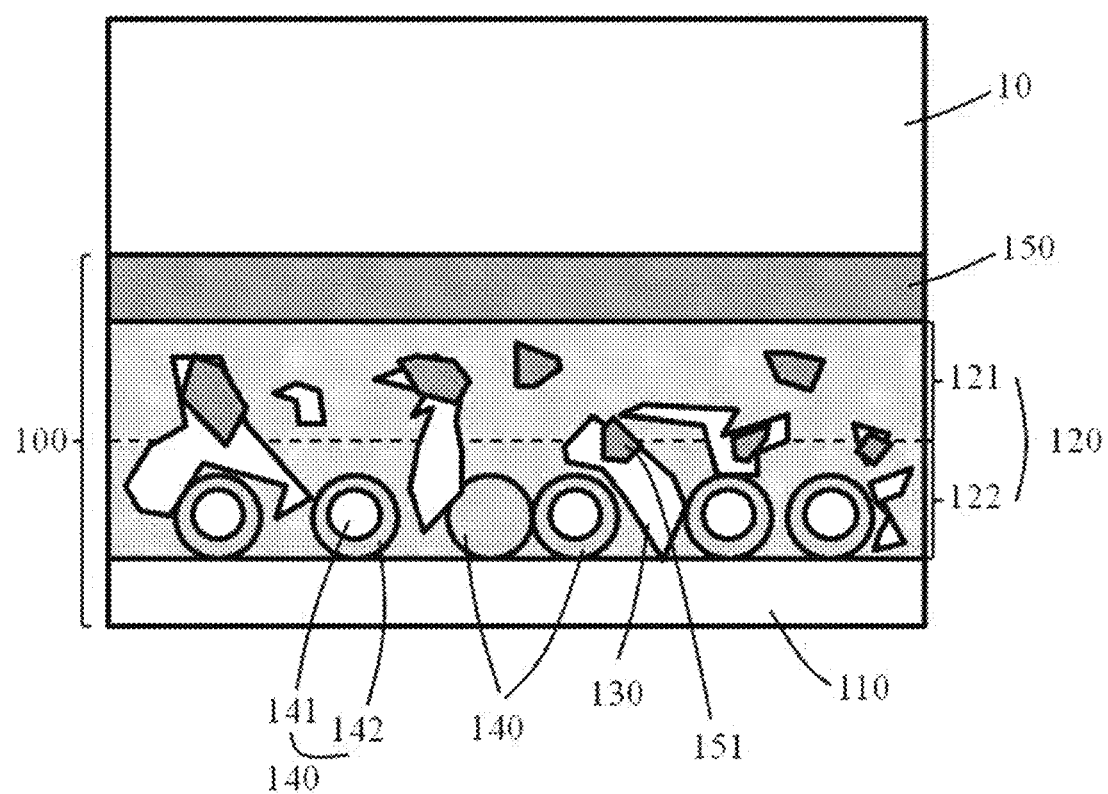
FIG. 1 is a cross-sectional view schematically illustrating a light extraction substrate for an OLED device and an OLED device having the light extraction substrate on a path, on which light exits, according to exemplary embodiments.

As illustrated in FIG. 1, a light extraction substrate for an OLED device (hereinafter, referred to as a "light extraction substrate") 100 according to exemplary embodiments is a substrate disposed on a path, on which light generated by an OLED 10 exits, to improve the light extraction efficiency of the OLED 10. In addition, the light extraction substrate 100 is a substrate protecting the OLED 10 from the external environment. The OLED 10 may be used as a light source of a lighting device.

Although not specifically illustrated, the OLED has a multilayer structure comprised of an anode, an organic light-emitting layer, and a cathode, sandwiched between the light extraction substrate 100 according to exemplary embodiments and another substrate facing the light extraction substrate 100 to encapsulate the OLED 10. The anode may be formed from a metal or metal oxide having a higher work function, such as Au, In, Sn, or indium tin oxide (ITO), to facilitate hole injection. The cathode may be a metal thin film formed from Al, Al:Li, or Mg:Ag that has a lower work function to facilitate electron injection. The organic light-emitting layer may include a hole injection layer, a hole transport layer, an emissive layer, an electron transport layer, and an electron injection layer that are sequentially stacked on the anode. When the OLED is a white OLED used for lighting, the light-emitting layer may have a multilayer structure comprised of, for example, a high-molecular light-emitting layer emitting blue light and a low-molecular light-emitting layer emitting orange-red light. In addition, a variety of other structures that emit white light may be used. The OLED may also have a tandem structure, in which a plurality of organic light-emitting layers alternate with interconnecting layers (not shown).

In this structure, when a forward voltage is induced between the anode and the cathode, electrons are transported from the cathode to the emissive layer through the electron injection layer and the electron transport layer, while holes are transported from the anode to the emissive layer through the hole injection layer and the hole transport layer. The electrons and the holes that have migrated into the emissive layer recombine with each other, thereby generating excitons. When these excitons transit from an excited state to a ground state, light is emitted. The brightness of the emitted light is proportional to the amount of current flowing between the anode and the cathode.

The light extraction substrate 100 used to improve the light extraction efficiency of the OLED 10 includes a base substrate 110, a scattering layer 120, a number of first light-scattering elements 130, and a planarization layer 150. The light extraction substrate 100 according to exemplary embodiments further includes a number of second light-scattering elements 140.

The base substrate 110 supports the scattering layer 120, the number of first light-scattering elements 130, the number of second light-scattering elements 140, and the planarization layer 150 disposed on one surface thereof. The base substrate 110 is disposed on a front portion of the OLED 10, i.e. on a path on which light emitted by the OLED 10 exits, to allow the emitted light to exit while functioning as an encapsulation substrate to protect the OLED 10 from the external environment.

The base substrate 110 may be a transparent substrate formed from any transparent material having superior light transmittance and excellent mechanical properties. For example, the base substrate 110 may be formed from a polymeric material, such as a thermally or ultraviolet (UV) curable organic film. Alternatively, the base substrate 110 may be formed from chemically strengthened glass, such as soda-lime glass ($SiO_2$—$CaO$—$Na_2O$) or aluminosilicate glass ($SiO_2$—$Al_2O_3$—$Na_2O$). When the OLED device including the light extraction substrate 100 according to exemplary embodiments is used for lighting, the base substrate 110 may be formed from soda-lime glass. The base substrate 110 may also be a substrate formed from a metal oxide or a metal nitride. According to exemplary embodiments, the base substrate 110 may be a flexible substrate, more particularly, a thin glass sheet having a thickness of 1.5 mm or less. The thin glass sheet may be manufactured using a fusion process or a floating process.

The scattering layer 120 is a matrix layer providing spaces in which the number of first light-scattering elements 130 are located while fixing the number of second light-scattering elements 140 to the base substrate 110. According to exemplary embodiments, the scattering layer 120 is formed from $TiO_2$. Although the scattering layer 120 has been described as being formed from rutile $TiO_2$, the scattering layer 120 according to exemplary embodiments is not specifically limited to rutile $TiO_2$. Rather, the scattering layer 120 according to exemplary embodiments may be formed from anatase $TiO_2$.

The rutile $TiO_2$ forms a porous structure. When the scattering layer 120 is formed from the porous rutile $TiO_2$, a number of voids having sizes at which the number of voids can scatter light, i.e. the number of first light-scattering elements 130 having zero refractive index, are formed within the scattering layer 120 during the process of forming the scattering layer 120. That is, rutile $TiO_2$ is a porous material inducing formation of the number of first light-scattering elements 130 in the form of voids. $TiO_2$, from which the scattering layer 120 is formed, is a high-refractive index (HRI) metal oxide having a refractive index of 2.5 to 2.7. When the number of first light-scattering elements 130 having a low refractive index of 1 and the number of second light-scattering elements 140 having a different refractive index are formed in the scattering layer 120, a complexified refractive index structure, such as a high-low refractive index structure or a high-low-high refractive index structure. When the complexified multi-refractive index structure as described above is disposed on a path, on which light emitted by the OLED 10 exits, the light extraction efficiency of the OLED 10 can be maximized.

Figure 2:
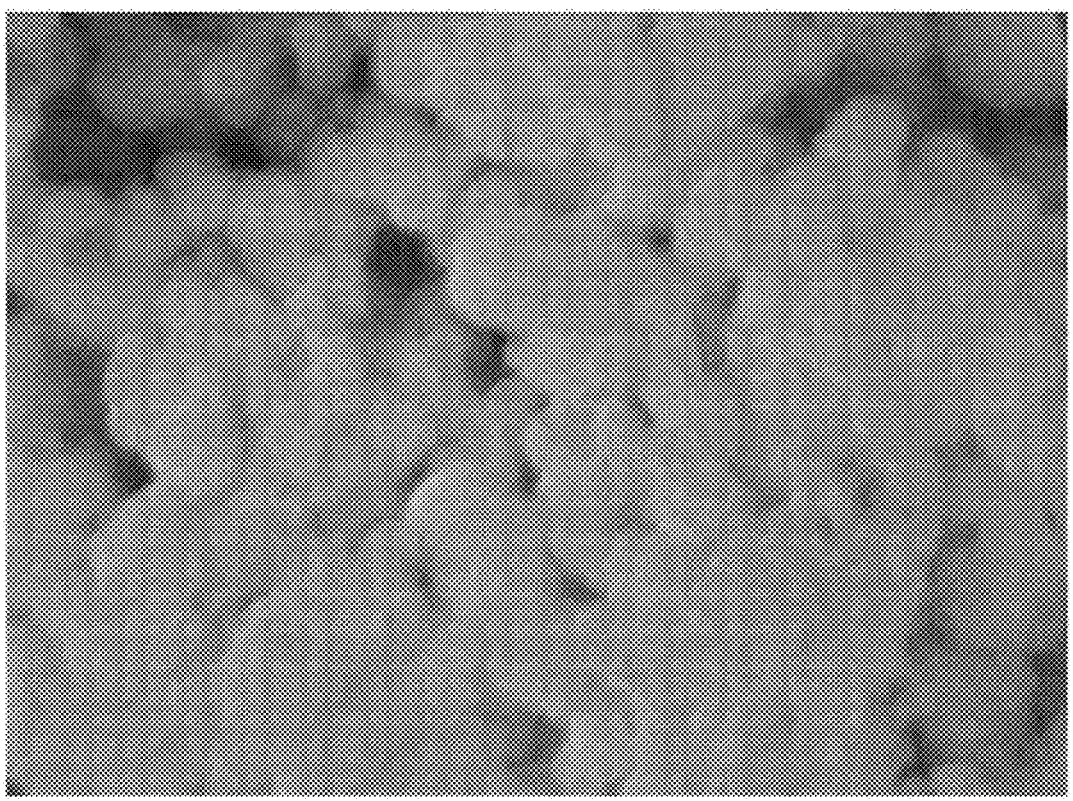
FIGS. 2 and 3 are electron microscope images of $TiO_2$ from which a scattering layer according to an exemplary embodiment is formed.
Figure 3:
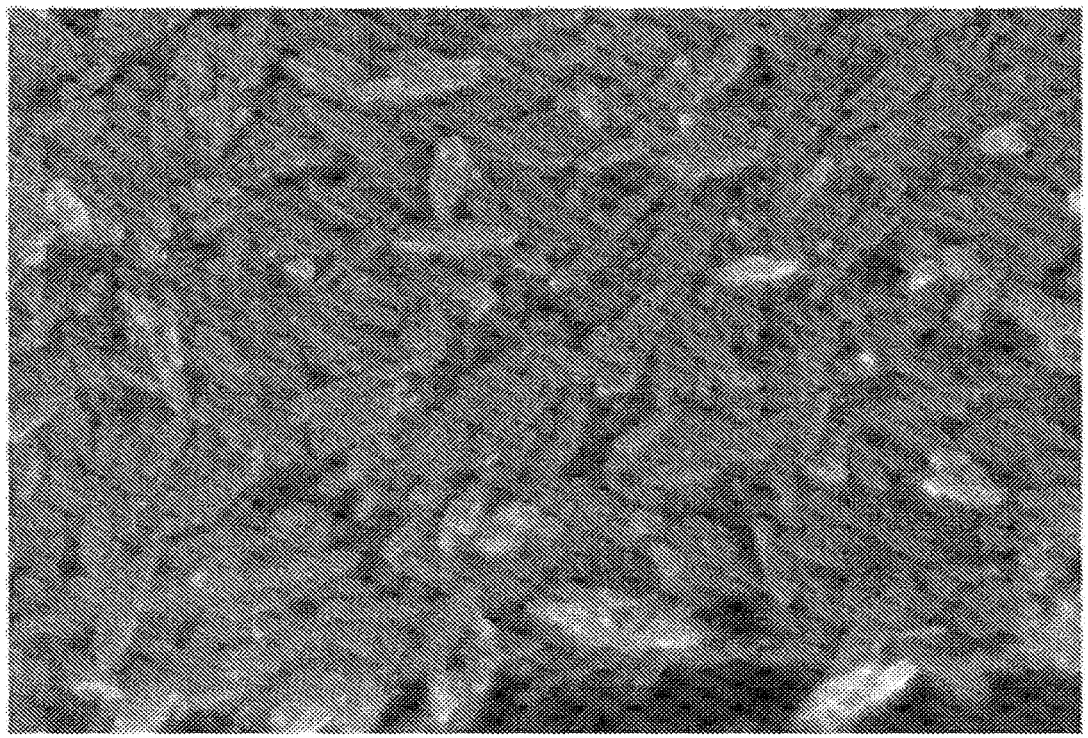
Figure 4:
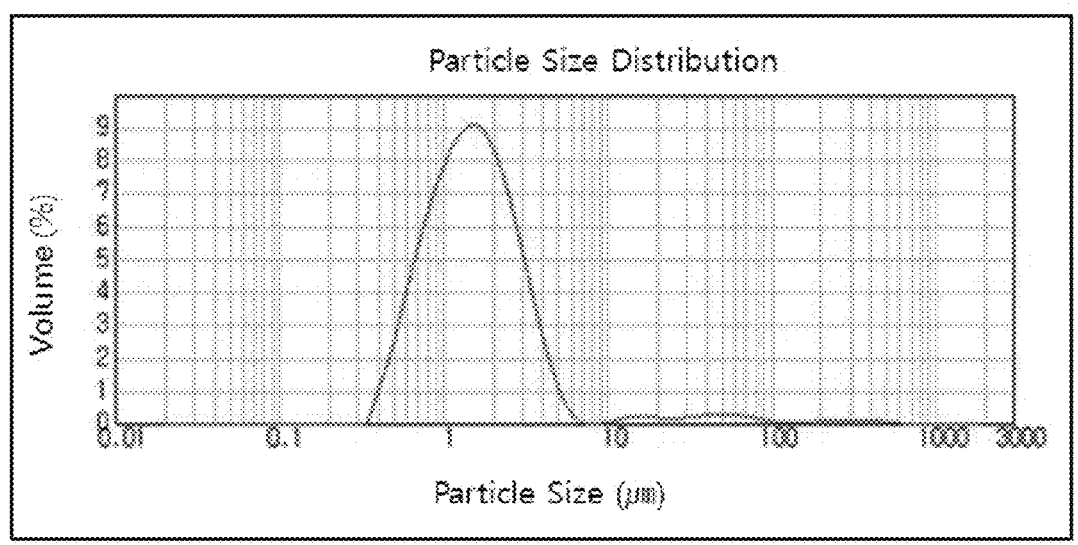
FIG. 4 is a graph illustrating the result of particle size analysis performed on dendritic crystalline solids.
Figure 5:
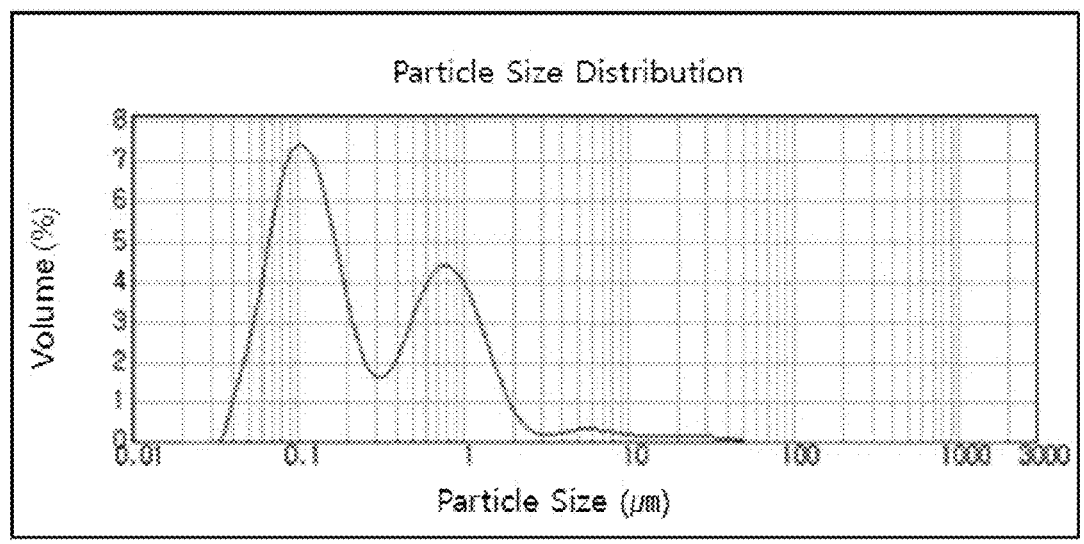
FIG. 5 is a graph illustrating the result of particle size analysis performed on rod-shaped crystalline solids.

According to exemplary embodiments, $TiO_2$ crystalline solids of the scattering layer 120 may have irregular shapes. For example, as illustrated in the electron microscope image of FIG. 2, $TiO_2$ crystalline solids of the scattering layer 120 may have dendritic shapes in which polyhedrons having 30 nm to 50 nm sizes are anisotropically connected. In addition, as illustrated in the electron microscope image of FIG. 3, $TiO_2$ crystalline solids of the scattering layer 120 may be rod-shaped crystalline solids having widths of 20 nm to 30 nm and lengths of 80 nm to 120 nm. Referring to the result of particle size analysis of FIG. 4, the sizes of aggregates respectively comprised of a predetermined number of the dendritic crystalline solids were measured to be 0.3 μm to 630 μm. In addition, referring to the result of particle size analysis of FIG. 5, the sizes of aggregates respectively comprised of a predetermined number of the rod-shaped crystalline solids were measured to be 0.035 μm to 53 μm. The shapes of $TiO_2$ crystalline solids may be determined by an organic solvent in which rutile $TiO_2$ is dispersed.

When the $TiO_2$ crystalline solids have the dendritic shapes or rod shapes as described above, the number of first light-scattering elements 130 induced by $TiO_2$ may also have a variety of shapes and sizes that can maximize light scattering.

The number of first light-scattering elements 130 are formed within the scattering layer 120. The number of first light-scattering elements 130 are voids formed during the process by which rutile $TiO_2$ of the scattering layer 120 is fired. Thus, the number of first light-scattering elements 130 are formed as voids having a variety of shapes and sizes, depending on the shapes of $TiO_2$ crystalline solids. According to exemplary embodiments, $TiO_2$ crystalline solids have irregular shapes, such as dendritic shapes or rod shapes, thereby imparting irregular shapes to the number of first light-scattering elements 130.

When the number of first light-scattering elements 130 as described above are formed within the scattering layer 120, the number of void-shaped first light-scattering elements 130 function to lower the average refractive index instead of acting as light-scattering elements having a refractive index of 1, thereby lowering the effective refractive index. Specifically, since the scattering layer 120 formed from rutile $TiO_2$ has the porous structure, the number of first light-scattering elements 130 having open structures are formed within the scattering layer 120. Thus, the number of first light-scattering elements 130 function as portions of the porous structure of the scattering layer 120, instead of functioning as separate light-scattering elements having a refractive index of 1. In this case, due to the complex effect in the refractive index of the number of first light-scattering elements 130 having open structures and rutile $TiO_2$, the average effective refractive index of the scattering layer 120 is lowered. This may not be a significant contribution to the improvement of light extraction efficiency. According to exemplary embodiments, the scattering layer 120 is infiltrated by the same material as a planarization-forming material from which the planarization layer 150 is formed. The infiltrating material is located in the scattering layer 120 to occupy portions of the number of first light-scattering elements 130, thereby converting the open structures of the number of first light-scattering elements 130 into closed structures. Thus, the remaining portions of the number of first light-scattering elements 130, in which the infiltrating material is not disposed, i.e. the portions of the number of first light-scattering elements 130 surrounded by the scattering layer 120 and the infiltrating material can act as light-scattering elements having a refractive index of 1, thereby causing a significant difference in refractive index from the scattering layer 120. The number of first light-scattering elements 130 causes, together with the number of second light-scattering elements 140, differences in refractive index from the scattering layer 120, while providing a complexified scattering structure, thereby maximizing improvements in the light extraction efficiency of the OLED 10.

According to exemplary embodiments, the ratio of the area of the number of first light-scattering elements 130 to the total area of the scattering layer 120 and the planarization layer 150 may range from 1.6% to 13.2%. The ratio of the area of the number of first light-scattering elements 130 may range from 6% to 20% of the area of the scattering layer 120. In the above-mentioned range, the wider the area of number of first light-scattering elements 130 is, the more the light extraction efficiency of the OLED 10 can be realized. This can consequently reduce the required amount of relatively expensive second light-scattering elements 140, thereby reducing manufacturing costs. The number of first light-scattering elements 130, induced by rutile $TiO_2$ of the scattering layer 120, occupy different areas depending on the positions within the scattering layer 120. The scattering layer 120 may be comprised of a top half layer 121 and a bottom half layer 122. The ratio of an area which the number of first light-scattering elements 130 occupy in the bottom half layer 122 is higher than the ratio of an area which the number of first light-scattering elements 130 occupy in the top half layer 121. Specifically, the ratio of the area which the number of first light-scattering elements 130 occupy in the bottom half layer 122 may be two to six times the ratio of the area which the number of first light-scattering elements 130 occupy in the top half layer 121. For example, the ratio of the area which the number of first light-scattering elements 130 occupy in the bottom half layer 122 may range from 14% to 18% of the area of the bottom half layer 122, while the ratio of the area which the number of first light-scattering elements 130 occupy in the top half layer 121 may range from 3% to 8% of the area of the top half layer 121. As described above, the ratio of the area which the number of first light-scattering elements 130 occupy in the bottom half layer 122 is two to six times the ratio of the area which the number of first light-scattering elements 130 occupy in the top half layer 121.

The number of second light-scattering elements 140 are disposed within the scattering layer 120, more particularly, within the bottom half layer 122 of the scattering layer 120. The number of second light-scattering elements 140 in the form of particles provide a complexified light-scattering structure together with the number of first light-scattering elements 130 in the form of voids. The number of second light-scattering elements 140 may be mixed with a material of the scattering layer 120 by a sol-gel method before being applied to the base substrate 110 along with the material of the scattering layer 120. In this manner, the number of second light-scattering elements 140 may be disposed or formed on the base substrate 110. Alternatively, the number of second light-scattering elements 140 may be provided on the base substrate 110 by a process separate from the process of forming the scattering layer 120, prior to the formation of the scattering layer 120, and then may be covered with the scattering layer 120.

According to exemplary embodiments, the number of second light-scattering elements 140 may be formed from one metal oxide or a combination of at least two metal oxides selected from the candidate group consisting of $SiO_2$, $TiO_2$, $ZnO$, and $SnO_2$. The number of second light-scattering elements 140 in the form of particles may have multi-refractive-index structures. For example, each of the number of second light-scattering elements 140 in the form of particles may have a core-shell structure comprised of a core 141 and a shell 142 having different refractive indices. The core 141 may be a hollow space. The number of second light-scattering elements 140 having the core-shell structures can further improve the efficiency of extracting light emitted by the OLED 10, based on the difference in refractive indices between the cores 141 and the shells 142.

The entirety of the number of second light-scattering elements 140 disposed within the scattering layer 120 may be particles having the core-shell structures or particles having a single refractive index. The number of second light-scattering elements 140 may be a mixture of particles respectively having a multi-refractive-index structure, such as a core-shell structure, and particles having a single refractive index.

As described above, the number of second light-scattering elements 140 disposed within the scattering layer 120 provides an internal light extraction layer (ILEL) of the OLED, together with the scattering layer 120, the number of first light-scattering elements 130, and the planarization layer 150. That is, the number of second light-scattering elements 140 provides the difference in the refractive index from the scattering layer 120, while diversifying paths, on which light emitted by the OLED 10 exits, together with the number of first light-scattering elements 130, thereby improving the light extraction efficiency of the OLED 10.

Figure 6:
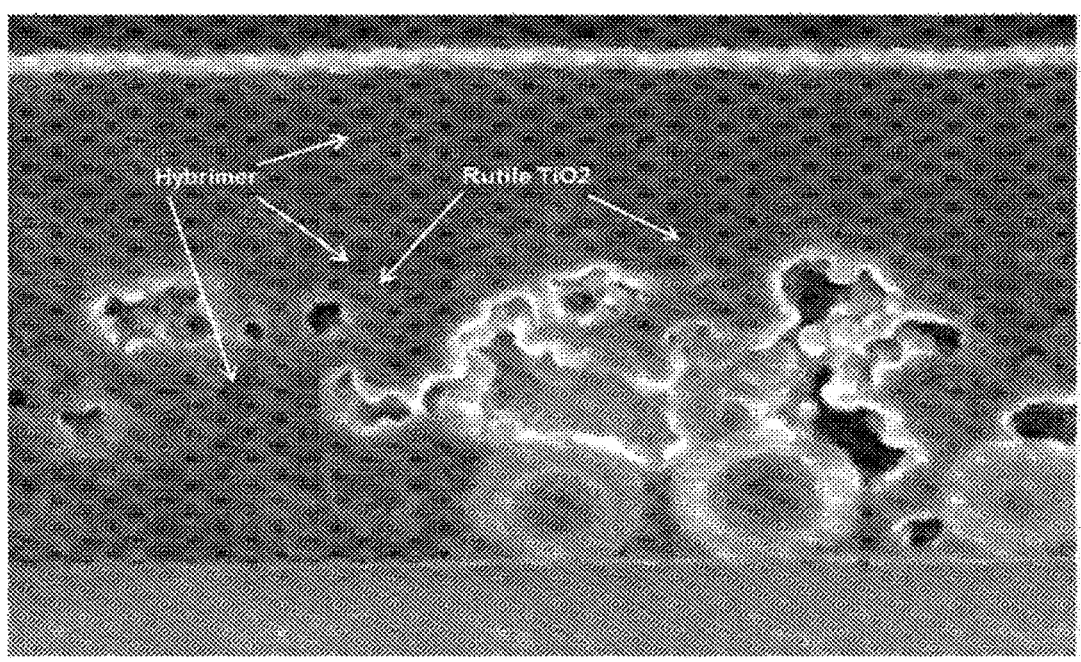
FIG. 6 is an electron microscope image of a cross-section of a light extraction substrate for an OLED device according to exemplary embodiments.
Figure 7:
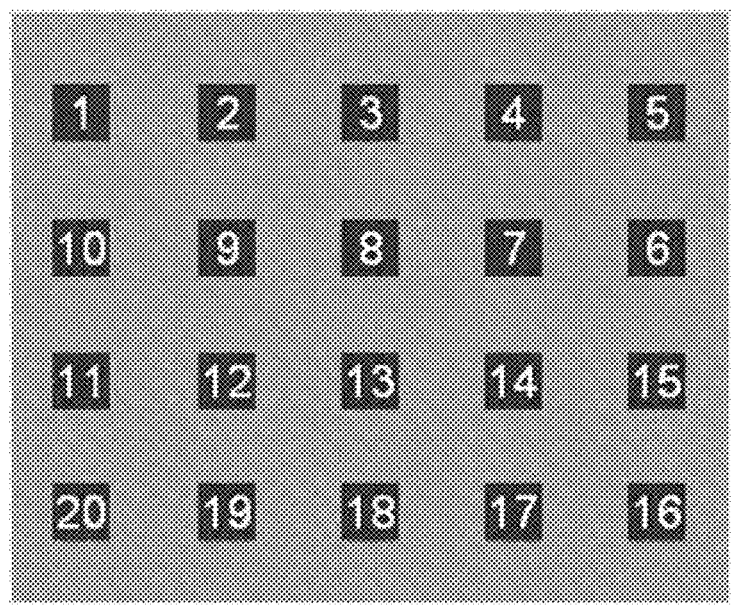
FIG. 7 is a conceptual view illustrating analysis points when FIB analyses are performed to samples #1, #2, and #5.

The planarization layer 150 is disposed on the scattering layer 120. As described above, when a large amount of the number of first light-scattering elements 130 are disposed within the scattering layer 120, the number of first light-scattering elements 130 do not act as light-scattering particles having a refractive index of 1. In this regard, according to exemplary embodiments, the planarization layer 150 is formed from an organic/inorganic hybrimer, allowing the number of first light-scattering elements 130 to act as the light-scattering particles. When the organic/inorganic hybrimer is applied to the top surface of the scattering layer 120 to form the planarization layer 150, a portion of the organic/inorganic hybrimer infiltrates into the scattering layer 120 formed from porous rutile $TiO_2$, as illustrated in the electron microscope image of FIG. 6. During this process, the infiltrating material occupies portions of the number of first light-scattering elements 130 in the form of voids. Consequently, the remaining portions of the number of first light-scattering elements 130 in which the hybrimer 151 is not disposed can act as light-scattering elements having a refractive index of 1.

The planarization layer 150 not only imparts the number of first light-scattering elements 130 with the characteristic light-scattering function as described above, but also planarizes the surface of the scattering layer 120. Since the surface of the planarization layer 150 abuts the anode, the surface of the planarization layer 150 is formed as a high-flat surface to prevent the degradation of the electrical characteristics of the OLED 10.

As described above, the light extraction substrate 100 according to exemplary embodiments includes the scattering layer 120 formed from porous rutile $TiO_2$, the number of first light-scattering elements 130 in the form of voids disposed within the scattering layer 120, the number of second light-scattering elements 140 in the form of particles, and the planarization layer 150 formed from the organic/inorganic hybrimer. Thus, the light extraction substrate 100 according to exemplary embodiments can improve the light extraction efficiency of the OLED 10 while contributing to realizing the reliability of the OLED 10.

In the light extraction substrate 100 according to exemplary embodiments, changes in light extraction efficiency according to the structures of the number of second light-scattering elements 140 were measured. When the number of second light-scattering elements 140 were only formed from $SiO_2$ having a single refractive index, the intensity of exited light was measured to be 69.0 lm/W. This is 1.97 times the intensity of exited light of an OLED without a light extraction layer, which is 35.1 lm/W. When the number of second light-scattering elements 140 formed from $SiO_2$ had core-shell structures with the hollow cores, the intensity of exited light was measured to be 70.3 lm/W. This is double the intensity of exited light of the OLED without a light extraction layer. When the number of second light-scattering elements 140 in the form of particles were not used, i.e. when only the number of first light-scattering elements 130 were used, the intensity of exited light was measured to be 63.3 lm/W, which is 1.8 times the intensity of exited light of the OLED without a light extraction layer. It can be appreciated that the highest light extraction efficiency was obtained when the number of first light-scattering elements 130 was combined with the number of second light-scattering elements 140 having the core-shell structures.

Hereinafter, the effect of the ratio of an area which the first light-scattering elements occupy on light extraction efficiency will be discussed. The first light-scattering elements are voids induced using rutile $TiO_2$, with portions of the voids being filled with the hybrimer.

To determine the effect of the ratio of the area of the first light-scattering elements on light extraction efficiency, the structures of samples #1 to #5 were analyzed using focused ion beams (FIB). The light extraction efficiencies of samples #1 to #5 were 1.82, 2.07, 1.84, 2.00, and 2.08 times the light extraction efficiency of an OLED without a light extraction layer, respectively. Each of the samples was analyzed by examining the cross-sectional shape of twenty equally spaced points on a light-emitting portion having a size of 2×2 $mm^2$.

Hereinafter, samples #1, #2, and #5, belonging to a haze 60% group due to most similar design structures, will be compared.

Figure 8:
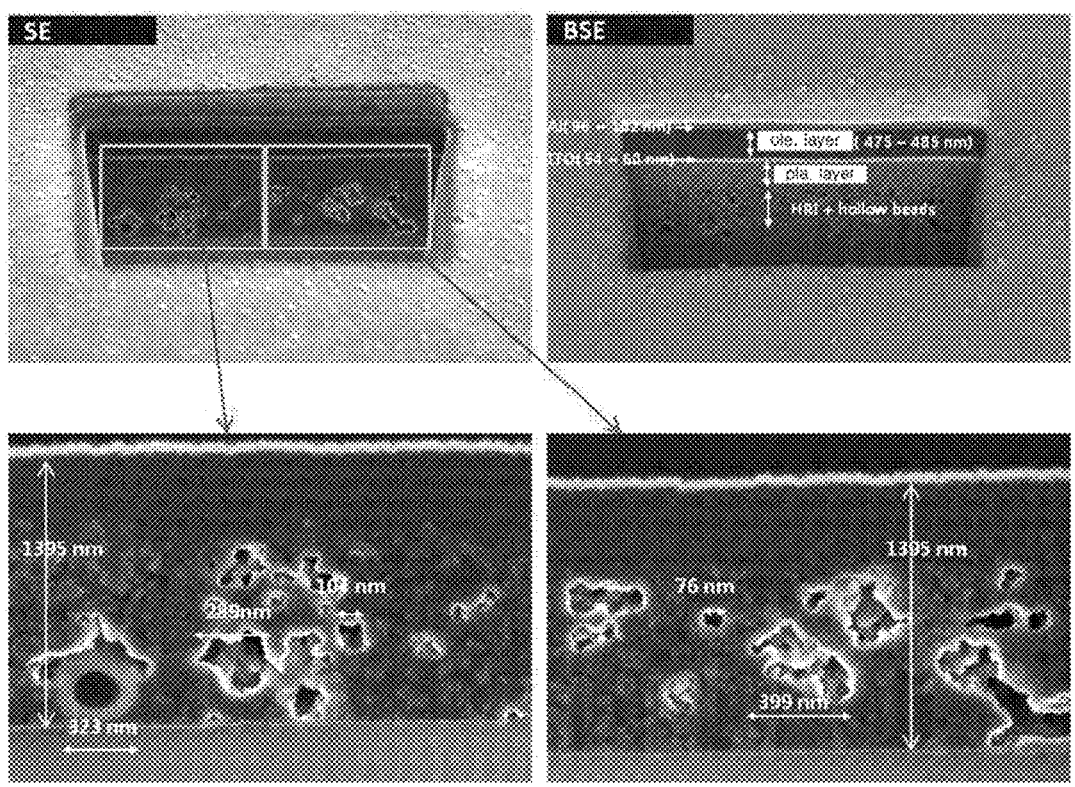
FIG. 8 illustrates analysis images of point 9 of sample #1.

FIG. 8 illustrates analysis images of point 9 of sample #1. Point 9 was divided into two sections, the cross-sectional shapes of the sections were examined, and the result is represented in Table 1.

TABLE 1

|  | Thickness/Size (nm) |
|---|---|
| Al Electrode | 96 to 102 |
| Organic Light-Emitting Layer | 475 to 485 |
| ITO | 54 to 60 |
| HRI + Planarization Layer | 1395 |
| Scattering Particle (Diameter) Hollow (Diameter) | Max 323 Max 185 |
| Scattering Void | 76 to 399 |
| HRI Layer Thickness (Average) | 994 |
| Planarization Layer Thickness (Average) | 401 |

Figure 9:
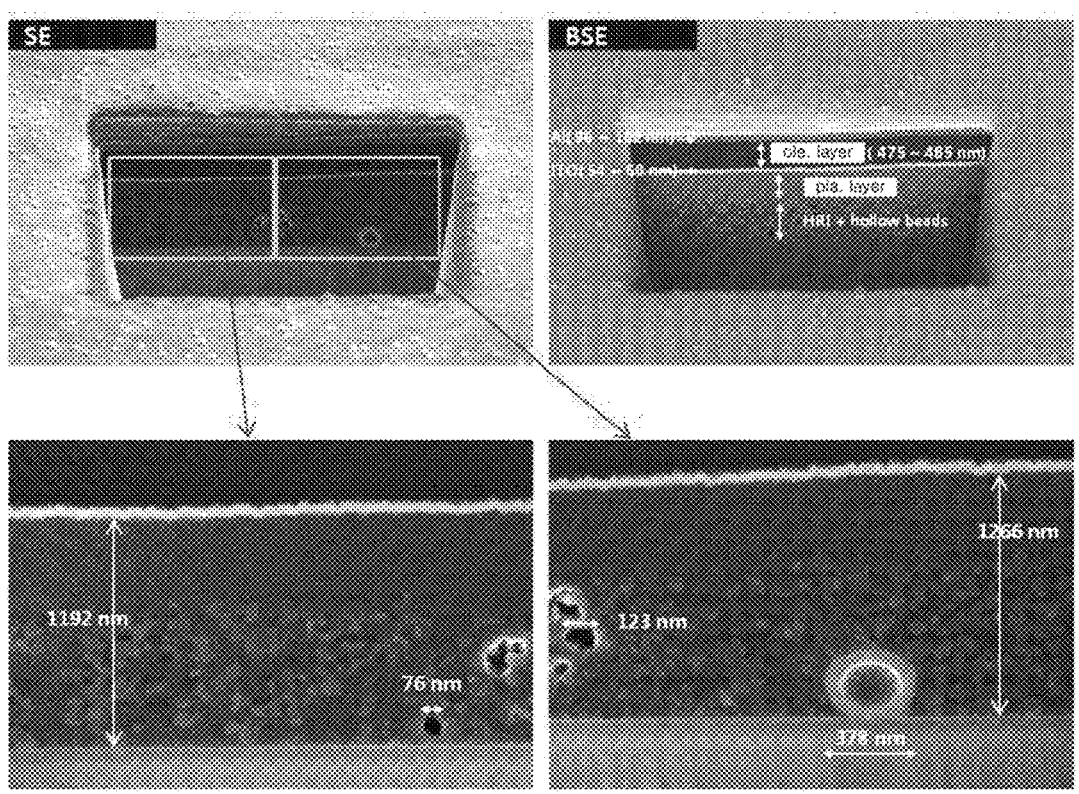
FIG. 9 illustrates analysis images of point 9 of sample #2.

FIG. 9 illustrates analysis images of point 9 of sample #2. Point 9 was divided into two sections, the cross-sectional shapes of the sections were examined, and the result is represented in Table 2.

TABLE 2

|  | Thickness/Size (nm) |
|---|---|
| Al Electrode | 96 to 102 |
| Organic Light-Emitting Layer | 475 to 485 |
| ITO | 54 to 60 |
| HRI + Planarization Layer | 1192 to 1266 |
| Scattering Particle (Diameter) Hollow (Diameter) | Max 378 Max 238 |
| Scattering Void | 76 to 123 |
| HRI Layer Thickness (Average) | 710 |
| Planarization Layer Thickness (Average) | 519 |

Figure 10:
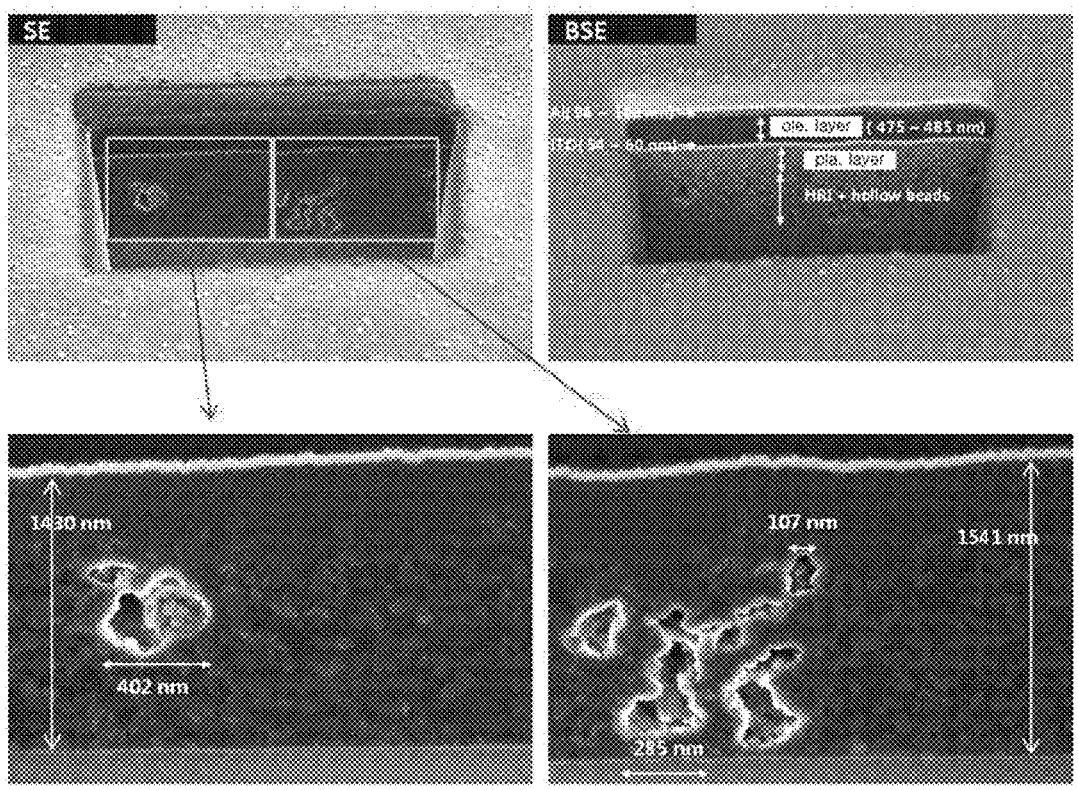
FIG. 10 illustrates analysis images of point 9 of sample #5.

FIG. 10 illustrates analysis images of point 9 of sample #5. Point 9 was divided into two sections, the cross-sectional shapes of the sections were examined, and the result is represented in Table 3.

TABLE 3

|  | Thickness/Size (nm) |
|---|---|
| Al Electrode | 96 to 102 |
| Organic Light-Emitting Layer | 475 to 485 |
| ITO | 54 to 60 |
| HRI + Planarization Layer | 1430 to 1541 |
| Scattering Particle (Diameter) | — |
| Scattering Void | 107 to 402 |
| HRI Layer Thickness (Average) | 1110 |
| Planarization Layer Thickness (Average) | 375 |

To calculate the average ratio of the area of scattering voids, i.e. first light-scattering elements, of each of samples #1, #2, and #5, the cross-sectional shapes of the points on crossing lines of each sample were measured in the same manner as in point 9.

Figure 11:
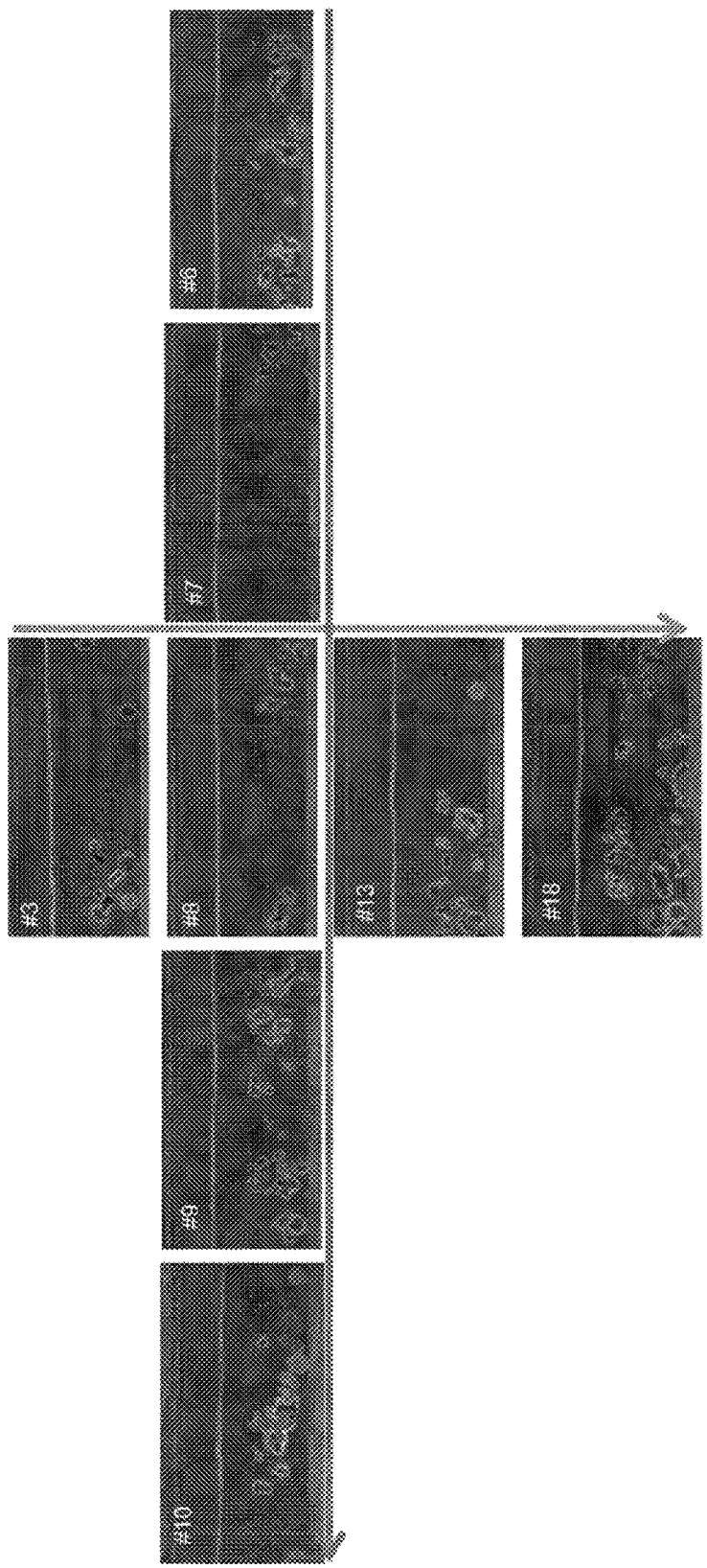
FIG. 11 illustrates analysis images of the points on the crossing lines of sample #1.

FIG. 11 illustrates analysis images of the points on the crossing lines of sample #1. The result is represented in Table 4.

TABLE 4

|  | Planarization Layer + HRI Thickness (nm) | Void Area, Ratio ($\mu m^2$, %) | Scattering Particle Area ($\mu m^2$) |
|---|---|---|---|
| Point 6 | 1263 | 0.43, 7.6 | 0.02 |
| Point 7 | 1340 | 0.13, 2.2 | — |
| Point 8 | 1316 | 0.21, 3.6 | — |
| Point 9 | 1375 | 0.49, 7.9 | 0.08 |
| Point 10 | 1267 | 0.32, 5.6 | 0.25 |
| Point 3 | 1273 | 0.15, 2.5 | 0.23 |
| Point 13 | 1350 | 0.20, 3.3 | 0.13 |
| Point 18 | 1541 | 0.59, 8.7 | 0.17 |

Table 5 represents average values of the measurements in Table 4.

TABLE 5

|  | Average |
|---|---|
| Planarization Layer + HRI Thickness (nm) | 1338 ± 85 |
| Void Area, Ratio ($\mu m^2$, %) | 0.30 ± 0.16, 5.0 ± 2.5 |
| Scattering Particle Area ($\mu m^2$) | 0.10 ± 0.10 |

Figure 12:
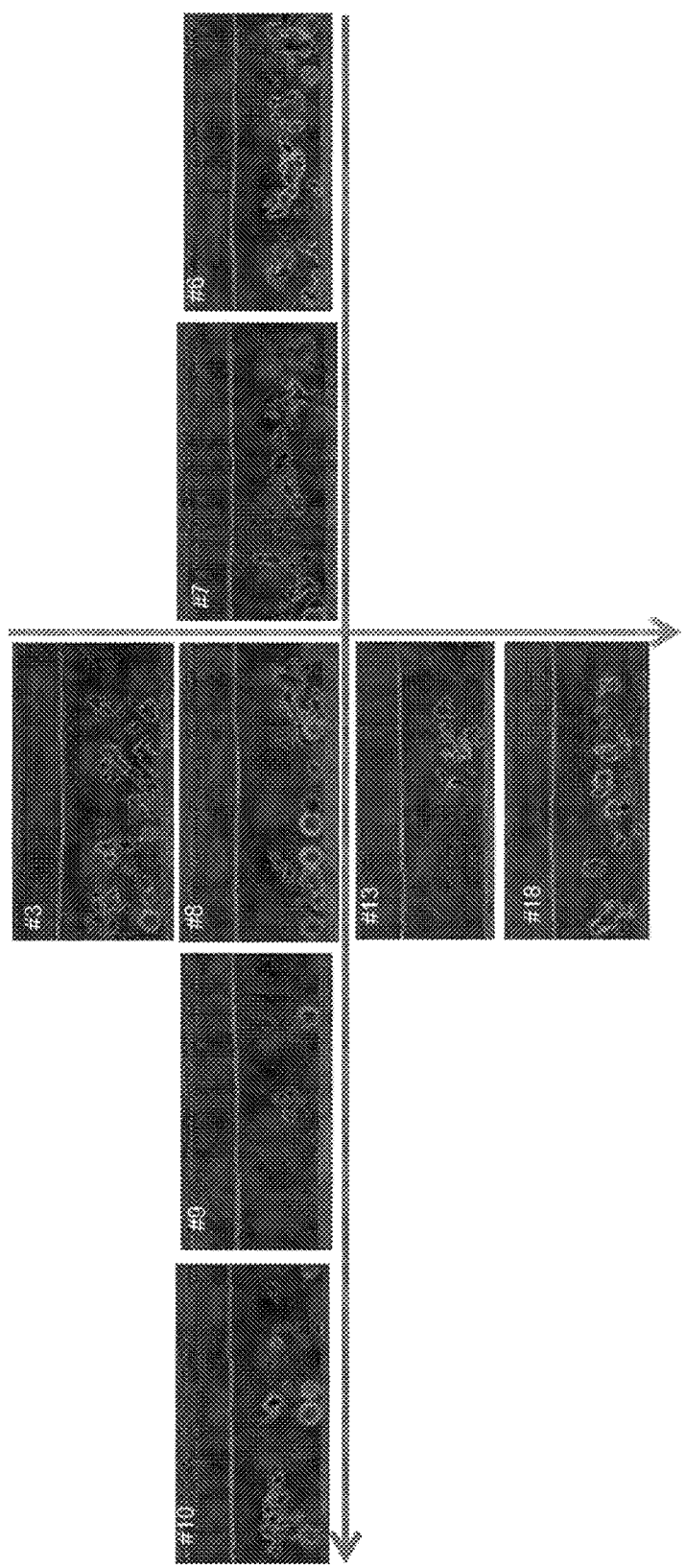
FIG. 12 illustrates analysis images of the points on the crossing lines of sample #2.

FIG. 12 illustrates analysis images of the points on the crossing lines of sample #2. The result is represented in Table 6.

TABLE 6

|  | Planarization Layer + HRI Thickness (nm) | Void Area, Ratio ($\mu m^2$, %) | Scattering Particle Area ($\mu m^2$) |
|---|---|---|---|
| Point 6 | 1283 | 1.02, 17.3 | 0.19 |
| Point 7 | 1395 | 0.67, 10.7 | 0.07 |
| Point 8 | 1176 | 0.41, 7.8 | 0.58 |
| Point 9 | 1187 | 0.04, 0.8 | 0.11 |
| Point 10 | 1269 | 0.35, 6.2 | 0.33 |
| Point 3 | 1434 | 0.77, 11.8 | 0.23 |
| Point 13 | 1261 | 0.24, 4.0 | — |
| Point 18 | 1368 | 0.58, 9.2 | — |

Table 7 represents average values of the measurements in Table 6.

TABLE 7

|  | Average |
|---|---|
| Planarization Layer + HRI Thickness (nm) | 1283 ± 97 |
| Void Area, Ratio ($\mu m^2$, %) | 0.50 ± 0.29, 8.4 ± 4.7 |
| Scattering Particle Area ($\mu m^2$) | 0.23 ± 0.22 |

Figure 13:
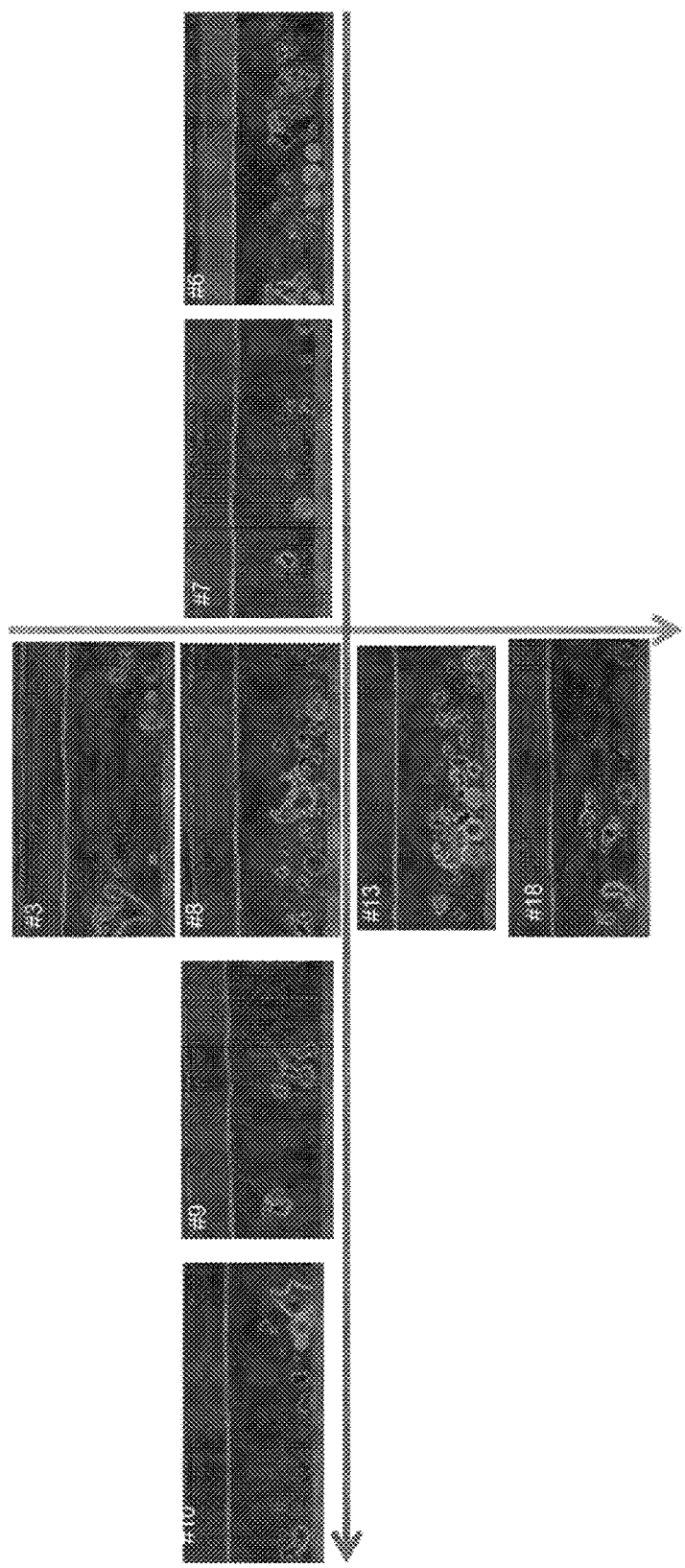
FIG. 13 illustrates analysis images of the points on the crossing lines of sample #5.

FIG. 13 illustrates analysis images of the points on the crossing lines of sample #5. The result is represented in Table 8.

TABLE 8

|  | Planarization Layer + HRI Thickness (nm) | Void Area, Ratio ($\mu m^2$, %) | Scattering Particle Area ($\mu m^2$) |
|---|---|---|---|
| Point 6 | 1318 | 0.79, 13.2 | 0.25 |
| Point 7 | 1179 | 0.09, 1.6 | 0.18 |
| Point 8 | 1287 | 0.55, 9.6 | 0.30 |
| Point 9 | 1470 | 0.33, 5.0 | — |
| Point 10 | 1232 | 0.37, 6.7 | 0.15 |
| Point 3 | 1387 | 0.35, 5.6 | 0.24 |
| Point 13 | 1281 | 0.56, 9.7 | 0.43 |
| Point 18 | 1268 | 0.23, 4.0 | 0.20 |

Table 9 represents average values of the measurements in Table 8.

TABLE 9

|  | Average |
|---|---|
| Planarization Layer + HRI Thickness (nm) | 1301 ± 85 |
| Void Area, Ratio ($\mu m^2$, %) | 0.43 ± 0.21, 7.2 ± 3.6 |
| Scattering Particle Area ($\mu m^2$) | 0.23 ± 0.12 |

Table 10 represents HRI thicknesses and void ratios (i.e. the ratio of areas which voids occupy) of the respective points with respect to HRI areas in the case in which the planarization layers in Table 2 are omitted.

TABLE 10

|  | HRI Thickness (nm) | Void Ratio (%) |
|---|---|---|
| Point 6 | 878.7 | 19.8 |
| Point 7 | 786.0 | 2.4 |
| Point 8 | 858.0 | 14.4 |
| Point 9 | 980.0 | 7.5 |
| Point 10 | 821.3 | 10.1 |
| Point 3 | 924.7 | 8.4 |
| Point 13 | 854.0 | 14.6 |
| Point 18 | 845.3 | 6.0 |

Comparing the measurements and the averages of samples #1, #2, and #5 illustrated in FIGS. 11 to 13 and represented in Tables 4 to 9, it can be appreciated that the ratios of areas which voids occupy in samples #2 and #5 having higher light extraction efficiency are greater than the ratio of an area which voids occupy in sample #1. This means that the number of first light-scattering elements in the form of voids according to exemplary embodiments contribute to improvements in the light extraction efficiency of an OLED.

Figure 14:
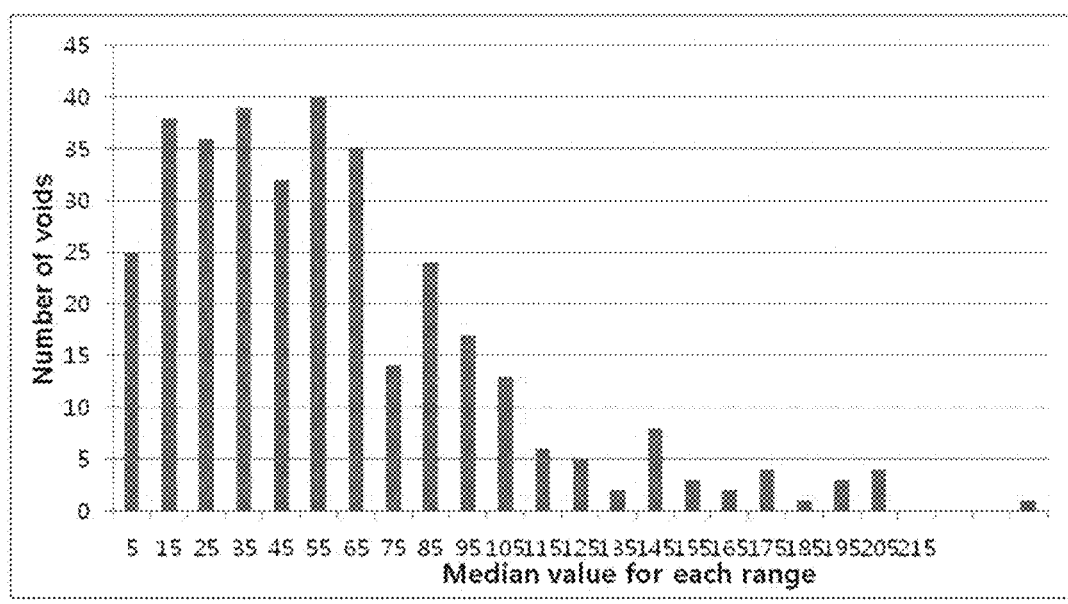
FIG. 14 is a histogram in the case in which voids, the areas of which are calculated by the image analyses as described above, are converted into circles having the same areas.

FIG. 14 is a histogram in the case in which voids, the areas of which are calculated by the image analyses as described above, are converted into circles having the same areas, in which the radii of the voids are listed in units of 0 nm to 10 nm. Referring to the histogram, the average radius of the voids is 60 nm, and the standard deviation is 44.4 nm.

The foregoing descriptions of specific exemplary embodiments of the present disclosure have been presented with respect to the drawings and are not intended to be exhaustive or to limit the present disclosure to the precise forms disclosed, and obviously many modifications and variations are possible for a person having ordinary skill in the art in light of the above teachings.

It is intended therefore that the scope of the present disclosure not be limited to the foregoing embodiments, but be defined by the Claims appended hereto and their equivalents.

The invention claimed is:

1. A light extraction substrate for an organic light-emitting device, comprising:
a base substrate;
a scattering layer disposed on the base substrate, the scattering layer being formed from $TiO_2$, a number of voids, as first light-scattering elements, formed within the scattering layer; and
a planarization layer disposed on the scattering layer,
wherein the scattering layer is infiltrated by a same material as a planarization-forming material from which the planarization layer is formed, wherein the infiltrating material infiltrating the scattering material fills a portion of the first light-scattering elements.

2. The light extraction substrate of claim 1, wherein the scattering layer comprises crystalline solids of $TiO_2$, sizes of which range from 30 nm to 50 nm.

3. The light extraction substrate of claim 2, wherein the scattering layer comprises aggregates, a plurality of crystalline solids among the crystalline solids being aggregated to form each of the aggregates, a size of which ranges from 0.3 µm to 630 µm.

4. The light extraction substrate of claim 2, wherein the scattering layer comprises aggregates, a plurality of crystalline solids among the crystalline solids being aggregated to form each of the aggregates, a size of which ranges from 0.035 µm to 53 µm.

5. The light extraction substrate of claim 1, wherein the scattering layer comprises crystalline solids of $TiO_2$, the crystalline solids being aggregated to form aggregates in irregular shapes.

6. The light extraction substrate of claim 5, wherein each of the aggregates has a dendritic shape or a rod shape.

7. The light extraction substrate of claim 1, wherein the first light-scattering elements have irregular shapes.

8. The light extraction substrate of claim 1, wherein the scattering layer comprises a number of particles, as second light-scattering elements, disposed within the scattering layer.

9. The light extraction substrate of claim 1, wherein a ratio of an area of the first light-scattering elements to a total area of the scattering layer and the planarization layer ranges from 1.6% to 13.2%.

10. The light extraction substrate of claim 1, wherein a ratio of an area of the first light-scattering elements to a total area of the scattering layer ranges from 6% to 20%.

11. The light extraction substrate of claim 1, wherein the scattering layer comprises a top half portion and a bottom half portion, a ratio of an area which the first light-scattering elements occupy in the bottom half portion being higher than a ratio of an area which the first light-scattering elements occupy in the top half portion.

12. The light extraction substrate of claim 11, wherein the ratio of the area which the first light-scattering elements occupy in the bottom half portion is two to six times the ratio of the area which the first light-scattering elements occupy in the top half portion.

13. The light extraction substrate of claim 12, wherein the ratio of the area which the first light-scattering elements occupy in the bottom half portion to a total area of the bottom half portion ranges from 14% to 18%.

14. The light extraction substrate of claim 13, wherein the ratio of the area which the first light-scattering elements occupy in the top half portion to a total area of the top half portion ranges from 3% to 8%.

15. The light extraction substrate of claim 8, wherein the scattering layer comprises a top half portion and a bottom half portion, and the second light-scattering elements are disposed within the bottom half portion.

16. The light extraction substrate of claim 8, wherein the second light-scattering elements are formed from one metal oxide or a combination of at least two metal oxides selected from a candidate group consisting of $SiO_2$, $TiO_2$, $ZnO$, and $SnO_2$.

17. The light extraction substrate of claim 16, wherein each of the second light-scattering elements comprises a single portion having a single refractive index only or multiple portions having different refractive indices.

18. The light extraction substrate of claim 17, wherein the multiple portions comprise a core and a shell surrounding the core, the shell having a refractive index different from a refractive index of the core.

19. The light extraction substrate of claim 18, wherein the core comprises a hollow space.

20. The light extraction substrate of claim 1, wherein the planarization layer is formed from an organic/inorganic hybrimer.

21. The light extraction substrate of claim 1, wherein the base substrate comprises a flexible substrate.

22. The light extraction substrate of claim 21, wherein the base substrate comprises a thin glass sheet having a thickness of 1.5 mm or less.

23. An organic light-emitting device comprising:
an organic light-emitting diode; and
the light extraction substrate as claimed in claim 1 disposed on a path on which light emitted by the organic light-emitting diode exits.

24. The light extraction substrate of claim 8, wherein a ratio of an area of the first light-scattering elements to a total area of the scattering layer and the planarization layer ranges from 1.6% to 13.2%.

25. The light extraction substrate of claim 8, wherein a ratio of an area of the first light-scattering elements to a total area of the scattering layer ranges from 6% to 20%.

26. The light extraction substrate of claim 8, wherein the scattering layer comprises a top half portion and a bottom half portion, a ratio of an area which the first light-scattering elements occupy in the bottom half portion being higher than a ratio of an area which the first light-scattering elements occupy in the top half portion.

* * * * *